(12) United States Patent
Froehnel et al.

(10) Patent No.: US 7,755,394 B2
(45) Date of Patent: Jul. 13, 2010

(54) CIRCUIT COMBINING LEVEL SHIFT FUNCTION WITH GATED RESET

(75) Inventors: Thomas Froehnel, Leonburg (DE); Guenter Mayer, Schwenwich (DE); Rolf Sautter, Boudorf (DE); Otto Wagner, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/196,427

(22) Filed: Aug. 22, 2008

(65) Prior Publication Data

US 2009/0058465 A1   Mar. 5, 2009

(30) Foreign Application Priority Data

Aug. 29, 2007   (EP) .................................. 07115158

(51) Int. Cl.
*H03K 19/0175* (2006.01)
(52) U.S. Cl. .............................. 326/81; 326/68; 326/80
(58) Field of Classification Search .................. 326/68, 326/80–81; 327/333
See application file for complete search history.

(56) References Cited

U.S. PATENT DOCUMENTS

| 6,265,896 B1 * | 7/2001 | Podlesny et al. .............. 326/80 |
| 7,525,367 B2 | 4/2009 | Behrends et al. |
| 2003/0067323 A1 * | 4/2003 | Kim et al. ..................... 326/81 |

* cited by examiner

*Primary Examiner*—Anh Q Tran
(74) *Attorney, Agent, or Firm*—Steven Chiu

(57) ABSTRACT

A circuit (01) combining level shift function with gated reset is described, performing a simple logic function with inputs supplied from a lower voltage (VD) and a drive out at its output (05) with a higher voltage (VC). Said circuit (01) comprises a gated reset scheme plus devices (10, 30, 40) for logic function.

1 Claim, 2 Drawing Sheets

(State of the Art)

CIRCUIT COMBINING LEVEL SHIFT FUNCTION WITH GATED RESET

BACKGROUND OF THE INVENTION

The invention relates to a circuit combining level shift function with gated reset.

Within microprocessors scaling of the power supply voltage occurs for power reduction and reliability reasons. Certain types of circuits are more sensitive to this reduction in voltage such as analog, memory and chip input/output (I/O) and/or receiving/driving circuits. To combat this, many chip designs have added extra power supply domains to use in these sensitive circuits.

If static logic gates are connected normally at the interface between a lower supply voltage VD and a higher supply voltage VC, as VC rises greater than a PFET (P-doped Field Effect Transistor) threshold voltage above VD, the PFET will turn on and a direct current (DC) will flow through the gate connected to VC. This will prevent a good down level on the output node. This problem can be exacerbated with wider gates in which multiple PFETs could be on and leaking DC current. Because of this, so-called level shifter circuits are known to interface between the different voltage supplies.

Thereby a larger operating range of such level shifter circuits towards a low VD and high VC is desired for memories in combination with a better clock to wordline delay tracking and a better wordline pulse width tracking. Further a minimum impact of the clock to wordline delay is desired providing a short circuit delay in combination with a small area impact. Additionally level shifter circuits with more complex functions are desired, allowing a reduction of area and thus power needy devices such as PFET devices.

SUMMARY OF THE INVENTION

It is therefore an object of the invention to provide a circuit combining level shift function with gated reset.

The object of the invention is met by a circuit combining level shift function with gated reset according to claim 1.

Thus a circuit according to the invention combining level shift function with gated reset performs a simple logic function such as 'and', 'or' with inputs supplied from a lower voltage VD and a drive out at its output with a higher voltage VC. Said circuit comprises a gated reset scheme that reduces the number of large p-doped devices such as PFETs for logic function to one.

Advantages of the circuit according to the invention over the state of the art are that the circuit allows more complex functions than a level shifter circuit, such as a simple logic function like 'and', 'or', possible with inputs supplied from a lower supply voltage VD. Further, the circuit according to the invention uses a gated reset scheme that reduces the number of large PFET devices for logic function to one. Compared with state of the art circuits, where in order to perform an 'or' function a stack of three p devices are required, two for the or function and one for the level shift function, with the circuit according to the invention a significant reduction in devices and thus area requirement is achieved. Additionally, the circuit according to the invention has no DC current in quiet state. Also compared to the state of the art, the circuit according to the invention has a higher circuit speed.

In a preferred embodiment of said invention, said gated reset scheme is implemented by a reset gate, driving the node W2 duplicating the logic function but with small devices.

In another preferred embodiment of said invention, the reset gate drives a NAND (Not And) gate whose other input is an inverted feedback from an output of the circuit, said NAND gate take care that a node connected with a gate of the device for logic function is always on high voltage except during reset transition.

BRIEF DESCRIPTION OF THE DRAWINGS

The foregoing, together with other objects, features, and advantages of this invention can be better appreciated with reference to the following specification, claims and drawings, with FIG. 1 showing a schematic diagram of a circuit combining level shift function with gated reset, and FIG. 2 showing a schematic diagram of a level shift circuit according to the state of the art.

DETAILED DESCRIPTION

Figure 1:
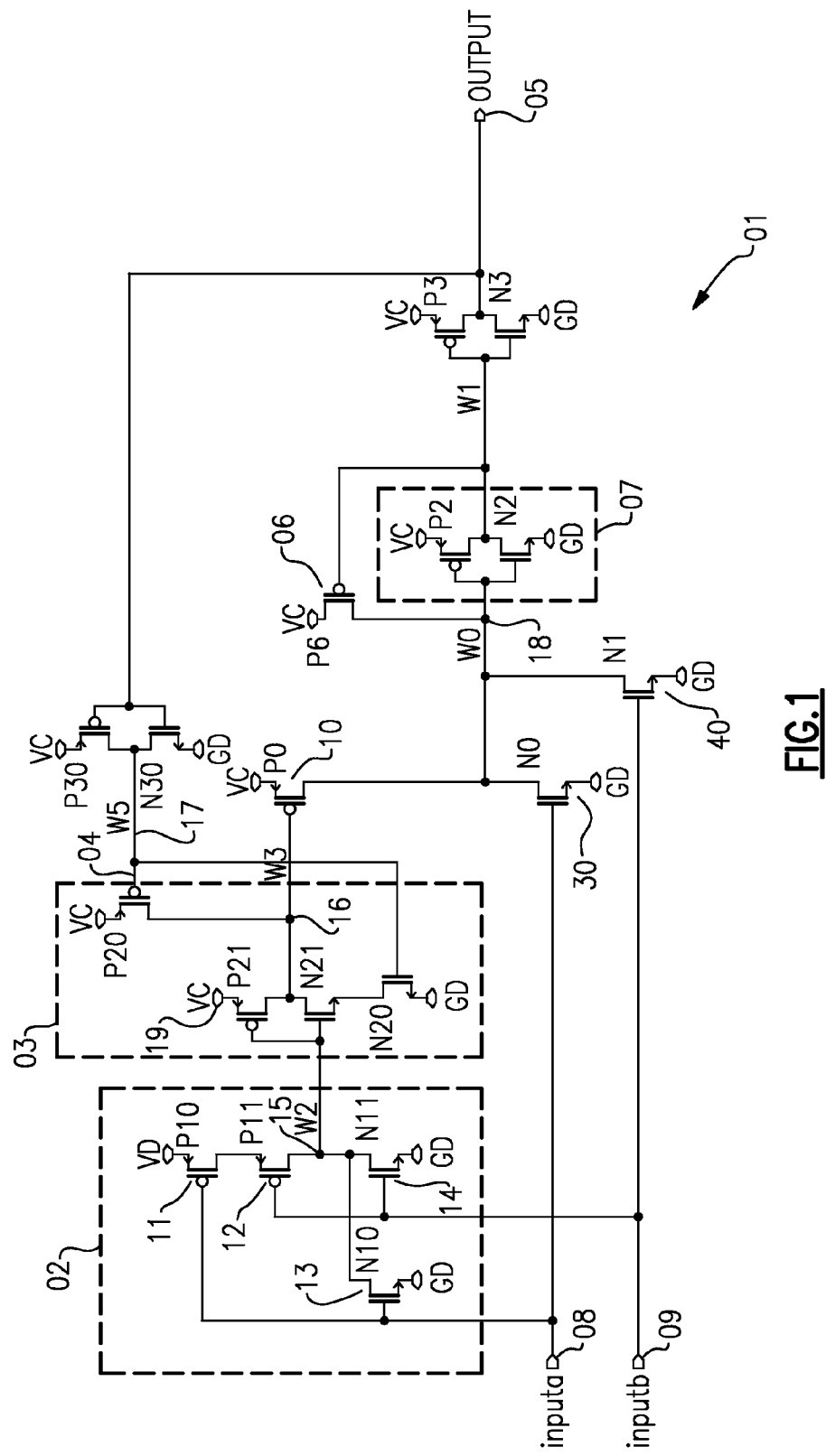

A circuit 01 combining level shift function with gated reset shown in FIG. 1 performs a simple logic function such as 'and', 'or' with inputs supplied from a lower voltage VD and drives an output 05 to or from a high voltage VC. The circuit 01 uses a gated reset scheme that reduces the number of large p-doped devices such as PFETs for logic function to one. The device within the circuit 01 for logic function is the PFET P0 10. Further devices for logic functions 'and', 'or' are the devices N0 30 and N1 40. The gated reset scheme is implemented by a reset gate 02, formed by the devices P10 11, P11 12, N10 13, N11 14 driving the node W2 15, duplicating the logic function but with small devices. It drives a NAND gate 03 whose other input 04 is the inverted feed back from the output 05. Thus the gated reset function is implemented. But the NAND gate 03 takes also care that node W3 16 is always on high voltage VC except during reset transition.

Reset, which for the circuit 01 is that the output 05 goes from low to high, is done with both inputs inputa 08 and inputb 09 both at zero volts, i.e. ground. Thereby node W2 15 goes to VD. As feedback node W5 17 is at high, node W3 16 is discharged and node W0 18 is pulled up, output 05 is rising to reset level VC. Node W3 16 is recovered to VC via the feedback. Thus only during this transition p device P21 19 between node W2 15 and W3 16 is in a condition with gate at VD and source at VC. Drain node in quiet states is always at VC and thus the p device P21 19 is in a no DC current condition in quiet states. No DC current in a quiet state is a requirement for level shifter circuits.

Figure 2:
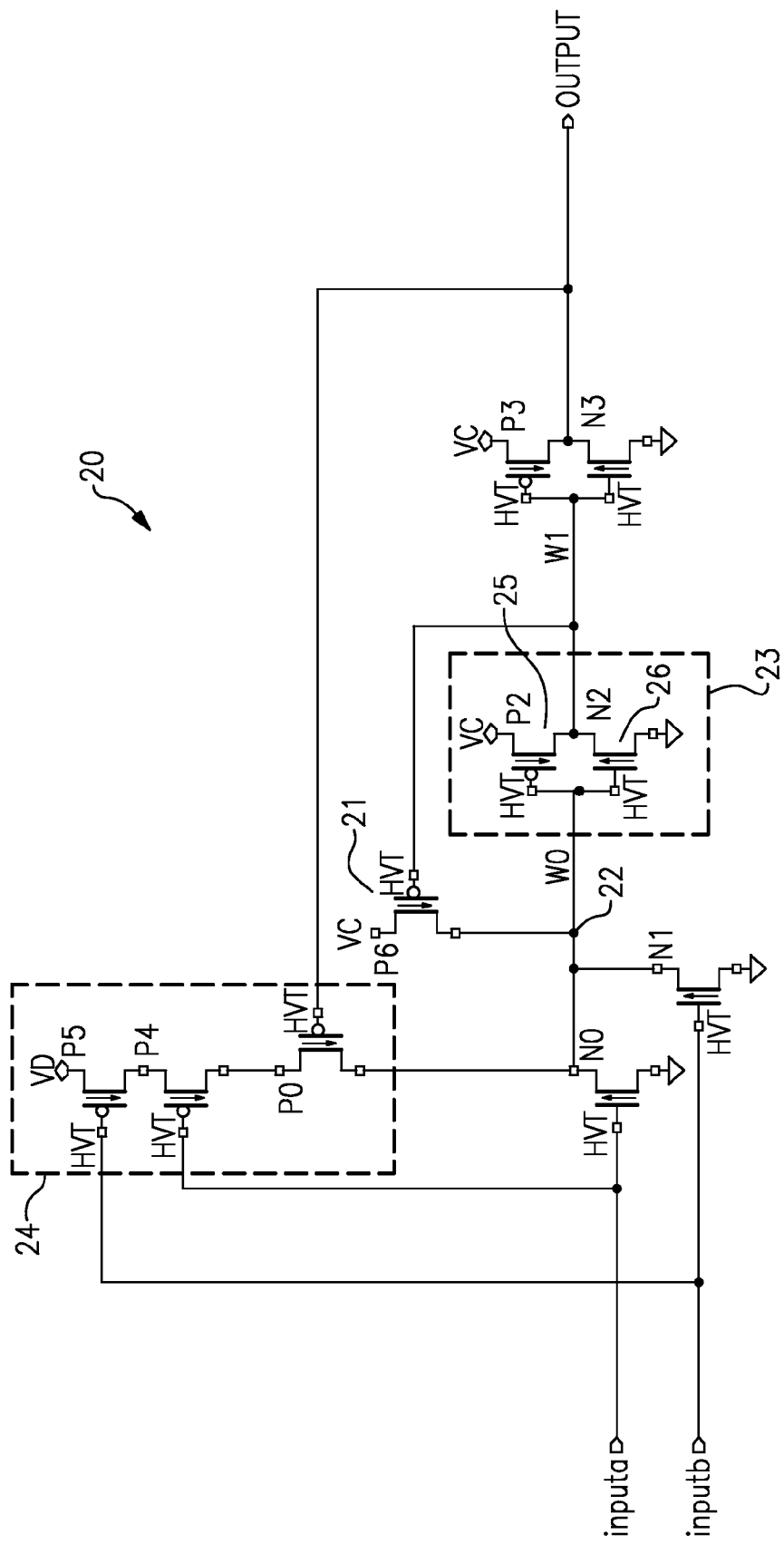

To achieve the same, a state of the art circuit 20 shown in FIG. 2 needs a bulky p device stack 24 and the keeper 21 has to raise the level of node W0 22 from lower supply voltage VD level to high voltage VC level. The inverter 23 made of the p device P2 25 and the n device N2 26 has here to switch with low input voltage VD and therefore has to be biased. The n device N2 26 has to be made stronger than the p device P2 25 to lower the threshold of this inverter 23. This slows down the reverse operation when node W0 22 is pulled down, which is the more critical function in terms of delay. To perform an 'or' function with the state of the art circuit 20 instead of one p device P0 10 as within the circuit 01 according to the invention, a stack 24 of three large p devices is required in circuit 20.

In contrast, the circuit 01 according to the invention allows more complex functions at higher speed. The circuit 01 according to the invention has a higher circuit speed because the level of node W0 18 is reset to the higher supply voltage VC with the device P0 10. Thus, the keeper 06 has not to raise the level of node W0 18 from VD to VC. Further the inverter

07 has not to switch with low input voltage VD. Thus the ratio of p to n device of the inverter 07 can be sized for best performance.

While the present invention has been described in detail, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. A circuit for combining level shift function with gated reset characterized in that the circuit performs a simple logic function with inputs supplied from a lower voltage and a drive out at its output with a higher voltage, said circuit comprising:

a gated reset scheme plus devices for logic function;

wherein the gated reset scheme is implemented by a reset gate, duplicating the logic function but with small devices; and wherein the reset gate drives a NAND gate whose other input is an inverted feed back from an output of the circuit, said NAND gate taking care that a node connected with a gate of a device for logic function is always on high voltage except during reset transition.

* * * * *